United States Patent [19]

Absalon et al.

[11] 4,010,487
[45] Mar. 1, 1977

[54] SEMICONDUCTOR ARRANGEMENT

[75] Inventors: Gunter Absalon; Konrad Fischer, both of Heilbronn; Rainer Grosholz, Heilbronn-Bockingen, all of Germany

[73] Assignee: Licentia Patent-Verwaltungs-G.m.b.H., Frankfurt am Main, Germany

[22] Filed: Feb. 23, 1972

[21] Appl. No.: 228,645

[30] Foreign Application Priority Data

Mar. 2, 1971 Germany .......................... 2109814

[52] U.S. Cl. ................................ 357/31; 250/518; 315/302
[51] Int. Cl.² ........................................ H01L 27/14
[58] Field of Search ..... 317/235 NA, 235 B, 234 F; 250/62.3, 518

[56] References Cited

UNITED STATES PATENTS

| | | | |
|---|---|---|---|
| 3,419,746 | 12/1968 | Crowell et al. | 315/10 |
| 3,428,850 | 2/1969 | Crowell et al. | 315/12 |
| 3,559,003 | 1/1971 | Beaudouin | 317/234 |
| 3,574,143 | 4/1971 | Vratny | 252/520 |
| 3,617,824 | 11/1971 | Shinoda | 317/235 R |
| 3,642,526 | 2/1972 | Itoh | 117/200 |
| 3,668,473 | 6/1972 | Miyashow | 317/234 R |
| 3,761,375 | 9/1973 | Pierce | 204/192 |

OTHER PUBLICATIONS

Handbook of Physics and Chemistry, 44th Edition, Chemical Rubber Publishing Co., Cleveland, Ohio, 1962, p. 1859.

*Primary Examiner*—Martin H. Edlow
*Attorney, Agent, or Firm*—Spencer & Kaye

[57] ABSTRACT

A semiconductor arrangement comprises a region of a second type of conductivity formed in a semiconductor body of a first type of conductivity from one surface thereof, an insulating layer on this surface defining an opening above the said region and a resistance layer covering the opening in the insulating layer and comprising a metal silicide compound of silicon with a metal from the subgroups of groups V or VI of the periodic system which contain tungsten, molybdenum or tantalum.

11 Claims, 1 Drawing Figure

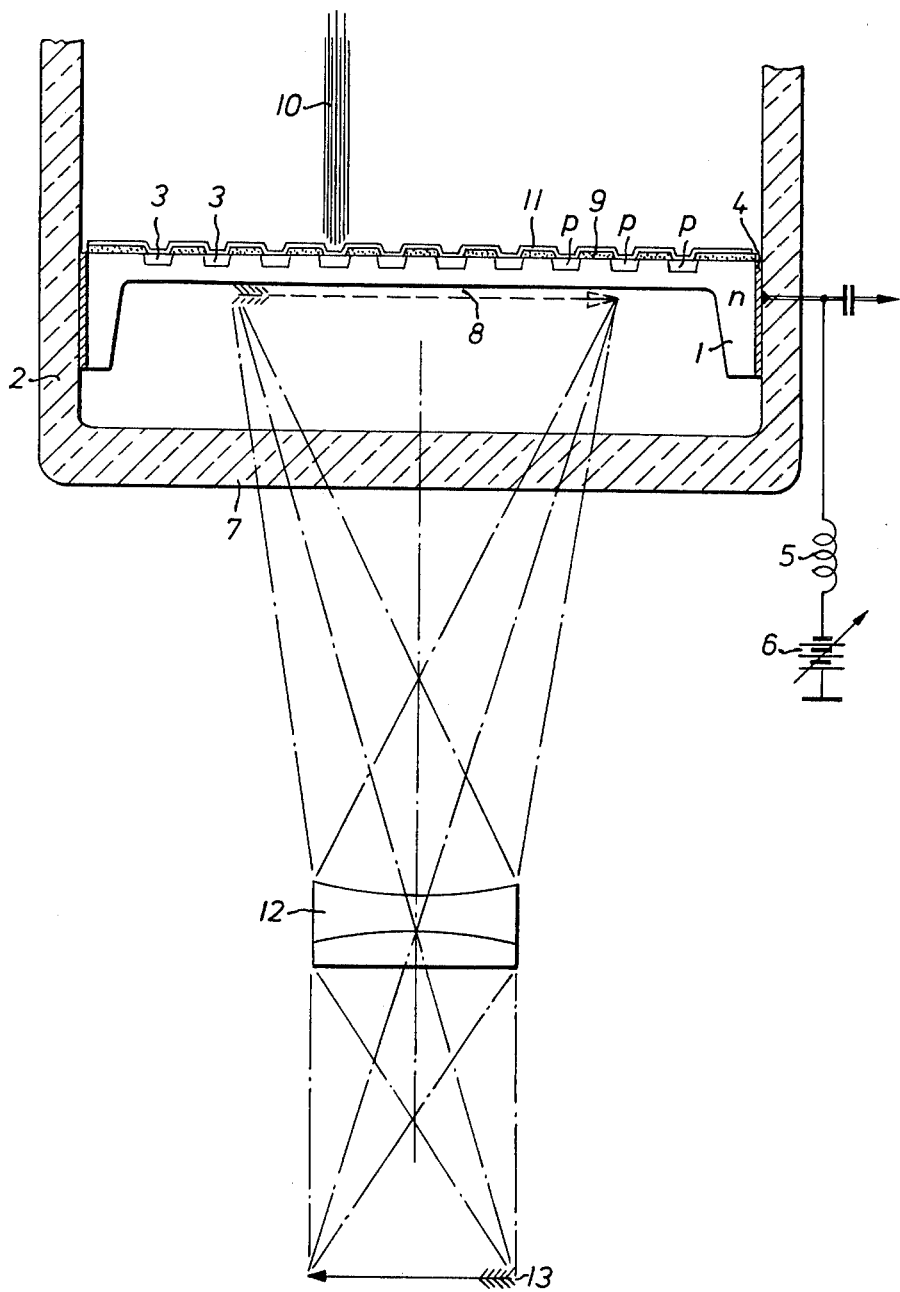

SEMICONDUCTOR ARRANGEMENT

BACKGROUND OF THE INVENTION

The invention relates to a semiconductor arrangement with a semiconductor body of a certain type of conductivity, with at least one further semiconductor region formed in the semiconductor body from one surface thereof, wherein the semiconductor surface common to all regions is provided with an insulating layer which has the opening at least above one of the semiconductor regions.

SUMMARY OF THE INVENTION

It is an object of the invention to provide a semiconductor arrangement in which the storing of charges on the surface of the insulating layer is avoided.

According to one aspect of the invention, there is provided a semiconductor arrangement comprising a semiconductor body of a first type of conductivity, a region of a second type of conductivity formed in said semiconductor body from one surface thereof, an insulating layer on said one surface of said semiconductor body and defining an opening above said region of said second type of conductivity and a resistance layer provided on said one surface of said semiconductor body, covering said opening in said insulating layer and comprising a metal silicide compound of silicon with at least one metal from the subgroups of groups V and VI of the periodic system in which tantalum, molybdenum and tungsten are contained.

According to a second aspect of the invention, there is provided a semiconductor arrangement comprising a semiconductor body of a first type of conductivity, a plurality of regions of a second type of conductivity formed in said semiconductor body from one surface thereof, an insulating layer on said surface of said semiconductor body and defining an opening above each of said plurality of regions of said second type of conductivity, and resistance layer means provided on said one surface of said semiconductor body, covering said openings in said insulating layer and comprising a metal silicide compound of silicon with at least one metal from the subgroups of groups V and VI of the periodic system which contain tantalum, molybdenum or tungsten.

BRIEF DESCRIPTION OF THE DRAWING

The invention will now be described in greater detail, by way of example, with reference to the drawing, the single FIGURE of which shows diagrammatically a semiconductor arrangement in accordance with the invention in use as a multiplex diode charge store for a pick-up tube.

DESCRIPTION OF THE PREFERRED EMBODIMENT

Because the semiconductor arrangement of the invention is particularly suitable for a multiplex diode charge store for a pick-up tube, the function of a multiplex diode store will first be explained with reference to the drawing.

A semiconductor plate 1 is mounted in a tube 2 which has a vacuum seal. The semiconductor plate fills substantially the cross-section of the tube. The semiconductor plate has a first type of conductivity and contains on one surface a plurality of regions 3 with the second type of conductivity, and forming diodes with the semiconductor body. For example, the semiconductor body may be provided on its outer circumference with an ohmic contact 4 which is connected through a resistor 5 with a voltage source 6. At the end facing the base body, the tube is closed by a transparent glass plate 7. A picture 13 is projected by means of a suitable lens 12 on to the rear side 8 of the semiconductor plate 1. The light impinging on the semiconductor body is absorbed at least partially in the semiconductor body, and pairs of charge carriers are produced.

The regions 3 with the second type of conductivity arranged on the other surface of the semiconductor plate are scanned by an electron beam 10, whilst the barrier layer capacitances of the individual diodes are charged. With a semiconductor body 1 of n-type conductivity and regions 3 of p-type conductivity, the voltage applied to the semiconductor body will, therefore, have to be positive relative to the voltage of the electron beam, so that the individual semiconductor diodes are operated in the blocking direction.

The movable charge carriers (holes) produced by the incidence of light in the semiconductor base body diffuse to the p-n junctions of the diodes, and discharge these diodes to an extent which depends on the amount of incident light. When the electron beam scans such a discharged diode during its next passage, this diode is again charged to the charge voltage determined by the voltage source 6. The charging current flowing during this process is transformed by the externally contacted semiconductor body into a signal voltage. Every diode represents, therefore, a picture spot, wherein the amount of light encountered in this diode region causes a corresponding discharge of the diode, and the amount of discharge must again be compensated by a corresponding charging current during the impingement of the electronic beam on the diode. The current required for every charging of a diode corresponds to a signal voltage. The individual signal voltages control at the end of a transfer path the intensity of an electron beam which scans, for example, a picture reproducing screen.

It has now been shown that, when the semiconductor surface is scanned by the electron beam, not only the individual diodes are charged but also the insulating layer 9. In the case of a silicon semiconductor plate, the insulating layer may consist, for example, of silicon dioxide. Since the charges cannot be removed from the insulating layer, these regions may be charged to a potential which is more negative than the cathode voltage of the tube. This gives rise to the formation of an electric field between every semiconductor region 3 and the adjacent parts of the insulating layer, and this field deflects the electron beam from the region 3. In this case, the discharged barrier layer capacitances are no longer charged and the pick-up of a picture and its correct reproduction become impossible.

One arrangement in which these drawbacks are avoided and in which a semiconductor arrangement is provided, wherein storing of charges on the surface of the insulating layer is avoided will now be described. In order to realise this semiconductor arrangement, it is proposed that the surface common to all regions is provided with a resistance layer, covering the insulating layer and the opening, and consisting of a metal silicide compound of silicon with a metal from the subgroups of group V and VI of the periodic system which contain tantalum, molybdenum or tungsten.

By means of this arrangement an undesirable charging of the insulating layer may be prevented notably in multiplex diode charge stores but in semiconductor arrangements of all kinds.

In the case of a multiplex diode charge store for a pick-up tube, a plurality of adjacent regions having the second type of conductivity may be formed from one surface in a semiconductor body with the first type of conductivity, the insulating layer covering this surface may have an opening above every region with the second type of conductivity, and the coherent or divided resistance layer may cover the openings and at least parts of the insulating layer.

Referring again to the drawing, the resistance layer 11 prevents the charging of the insulating layer 9, because the charge is shunted through the resistance layer 11 to the nearest region 3 in the semiconductor plate. Due to the charge equalisation no field is formed which might deflect the electron beam. However, with the multiple diode charge store, the resistance layer has such a high value that a discharge of the barrier layer capacitance is impossible during the time between two scanning steps.

The thickness of the resistance layer is preferably between 100 A and 10 $\mu$m. The layer resistance is within the range of about $10^{15}$ to $10^6 \Omega/\square$. The layer resistance is defined as the quotient of specific resistance and layer thickness.

Particularly preferred resistance layers are those consisting of one of the tungsten silicides, tantalum silicides, and molybdenum silicides. The resistance layer may consist of different compositions of several of these metal silicide compounds. In one embodiment of the multiplex diode charge store, a layer resistance of $10^{13} \Omega/\square$ proved to be particularly advantageous. For producing such high resistance or even higher resistance layers, the metal silicide compound is preferably mixed at a suitable ratio with a glass or ceramic compound. Silicon dioxide may be used, for example, as the glass admixture. The proportion of glass may reach any appropriate mixing ratio. If, on the other hand, a resistance layer of lower value is to be achieved, it consists of a pure metal silicide compound. Preferably, the resistance layer is applied by evaporation in a vacuum to the semiconductor surface, with the material to be evaporated being located in a heatable vessel.

The resistance layer according to the invention has a particularly good compatability with the silicon of the semiconductor layer and with the silicon dioxide of the insulating layer. Furthermore, this layer is resistant to tempering in air, nitrogen, oxygen, or in a vacuum up to temperatures of about 1100° C. Since evacuated pickup tubes must be heated for longer times at temperatures of about 400° C, this temperature stability is of particular advantage.

The resistance layer on the surface of a semiconductor plate containing a multiplex diode charge store may preferably also be divided into individual zones. In this case, every individual zone covers an opening in the insulating layer and the adjacent parts of the insulating layer. Every individual zone is separated from the adjacent individual zones by a more or less wide gap.

It will be understood that the above description of the present invention is susceptible to various modifications changes and adaptations.

What is claimed is:

1. A multidiode charge store for an electron beam picture pickup tube comprising in combination; a semiconductor body of a first type of conductivity, a plurality of juxtaposed regions of a second type of conductivity formed in said semiconductor body from one surface thereof and forming respective diodes therewith, an insulating layer on said surface of said semiconductor body and defining an opening above each of said plurality of regions of said second type of conductivity which openings extend to said surface of said semiconductor body, and a resistance layer provided on said one surface of said semiconductor body, said resistance layer covering the exposed portions of said regions within said openings in said insulating layer and extending over at least the adjacent portions of said insulating layer surrounding said openings, said resistance layer having a resistance which is sufficiently high so as to constitute a means for avoiding an interfering charge of said insulating layer by the electron beam scanning said surface of said semiconductor body and a discharge of the barrier layer capacitance of the diodes between two successive scans, said resistance layer comprising a metal silicide compound with the metal being selected from the subgroups of groups V and VI of the periodic table which contain tantalum, molybdenum or tungsten.

2. A charge store as defined in claim 1, wherein said resistance layer comprises a coherent single layer.

3. A charge store as defined in claim 1, wherein said resistance layer comprises material in layer form of a thickness between 100A and 10 $\mu$m.

4. A charge store as defined in claim 1, wherein said resistance layer comprises material in layer form having a layer resistance between $10^6 \Omega/\square$ and $10^{15} \Omega/\square$.

5. A charge store as defined in claim 1, wherein said resistance layer comprises several of said metal silicide compounds.

6. A charge store as defined in claim 1, wherein said resistance layer comprises one of the tantalum, tungsten or molybdenum silicides.

7. A charge store as defined in claim 2, wherein said resistance layer comprises one of said metal silicide compounds admixed with a ceramic or glass compound.

8. A charge store as defined in claim 2, wherein said semiconductor comprises silicon and said insulating layer comprises silicon dioxide.

9. A charge store as defined in claim 1 wherein said resistance layer consists of a metal silicide compound with the metal belonging to the subgroup of group VI of the periodic table containing molybdenum and tungsten.

10. A charge store as defined in claim 4 wherein said resistance layer consists of one of said metal silicide compounds.

11. A charge store as defined in claim 4 wherein said resistance layer consists of a mixture of one of said metal silicide compounds and a ceramic compound.

* * * * *